United States Patent
Schroeder

(10) Patent No.: US 7,199,915 B2
(45) Date of Patent: Apr. 3, 2007

(54) BUFFERS FOR LIGHT MODULATION ELEMENTS IN SPATIAL LIGHT MODULATORS

(75) Inventor: Dale W. Schroeder, Scotts Valley, CA (US)

(73) Assignee: Avago Technologies Fiber IP (Singapore) Pte. Ltd. (SG)

( * ) Notice: Subject to any disclaimer, the term of this patent is extended or adjusted under 35 U.S.C. 154(b) by 253 days.

(21) Appl. No.: 10/810,067

(22) Filed: Mar. 26, 2004

(65) Prior Publication Data

US 2005/0213189 A1    Sep. 29, 2005

(51) Int. Cl.
G02B 26/00    (2006.01)
G02F 1/07    (2006.01)
G09G 3/36    (2006.01)

(52) U.S. Cl. ............... 359/245; 359/290; 359/295; 345/100

(58) Field of Classification Search ........... 359/198, 359/245, 254, 259, 290, 295; 345/87, 98–100, 345/213
See application file for complete search history.

(56) References Cited

U.S. PATENT DOCUMENTS 5,699,498 A * 12/1997 Noorbakhsh ............... 345/591
6,078,316 A *  6/2000 Page et al. .................. 345/204

* cited by examiner

*Primary Examiner*—Ricky Mack
*Assistant Examiner*—William Choi

(57) ABSTRACT

A circuit element that can be used, for example, in a spatial light modulator to photolithographically transfer an image onto a substrate, includes a strobe buffer connected between a strobe line and at least two associated circuit elements to buffer the strobe signal on the strobe line and provide a buffered strobe signal to the associated circuit elements. The strobe line is electrically coupled to a set of the circuit elements to provide a strobe signal thereto. The strobe signal causes the circuit elements in the set to shift data to additional circuit elements outside of the set. The circuit elements are alterable in response to data stored therein.

21 Claims, 11 Drawing Sheets

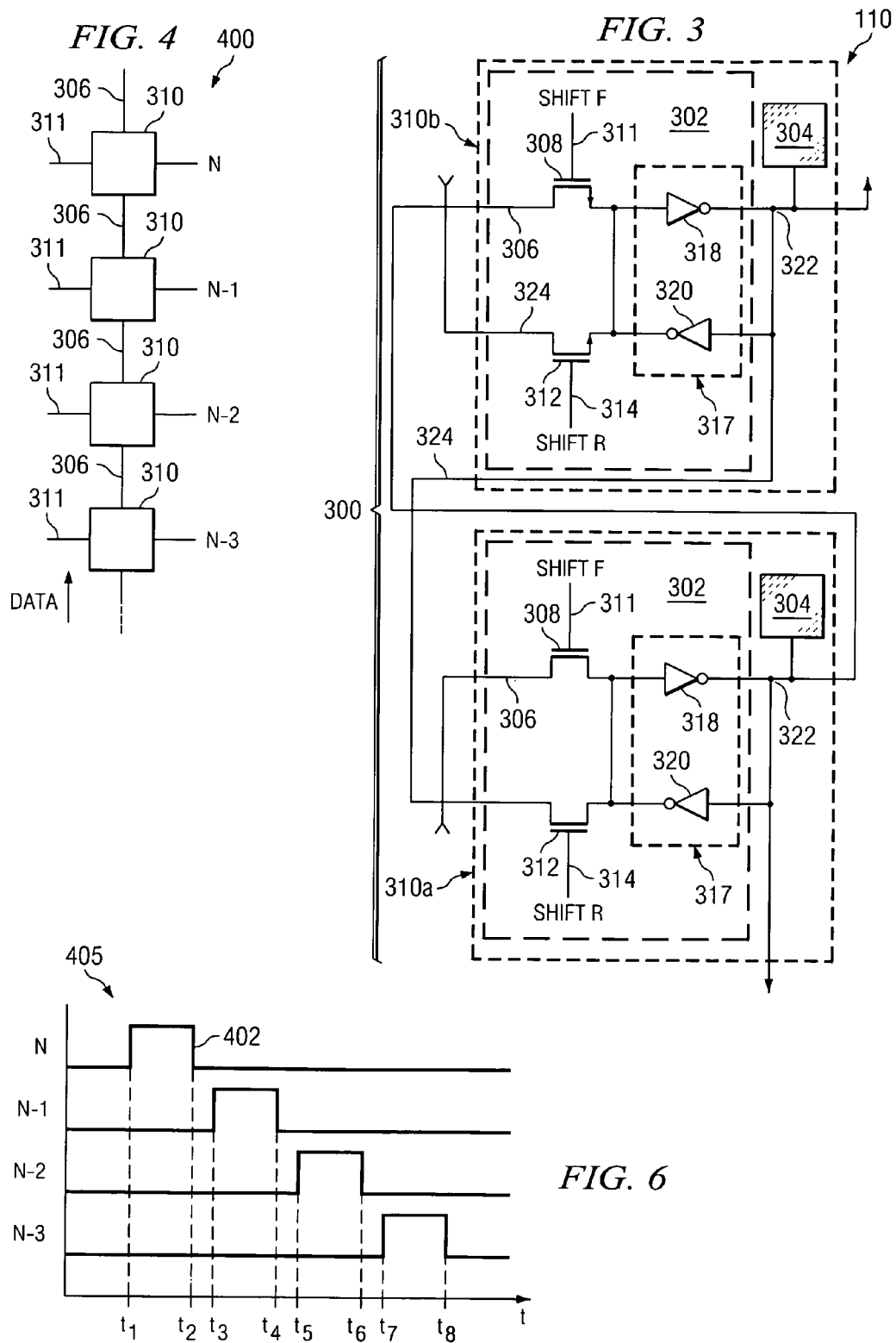

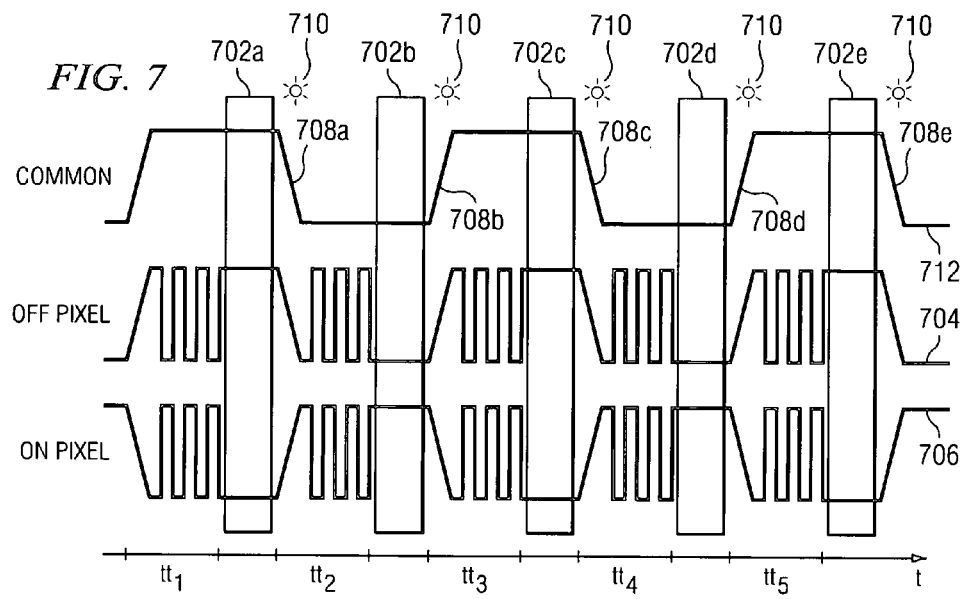
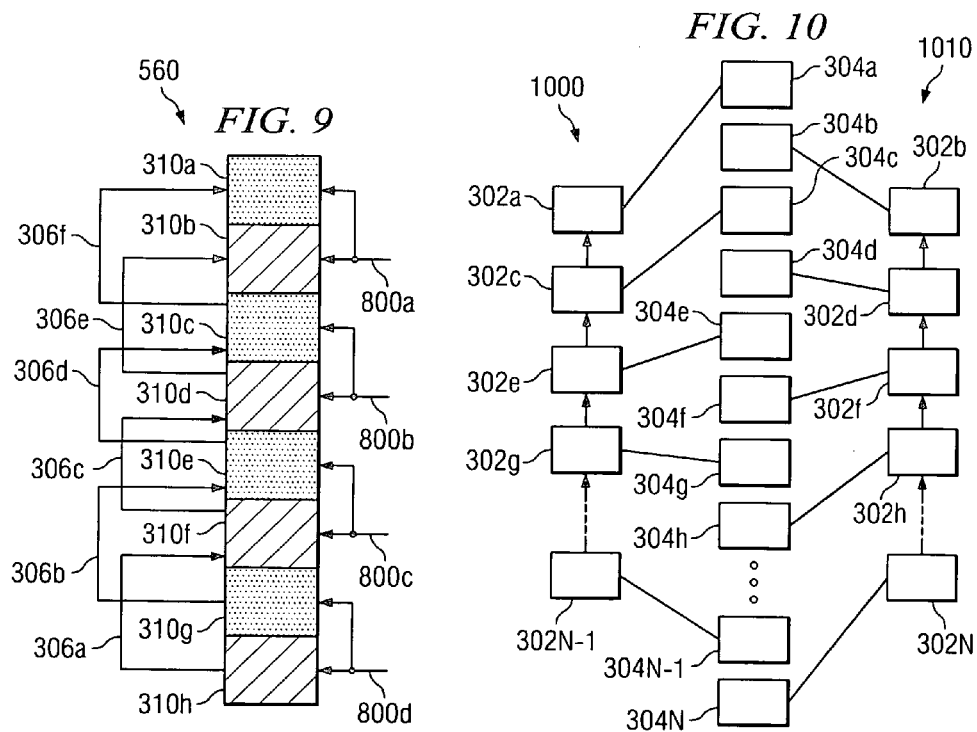

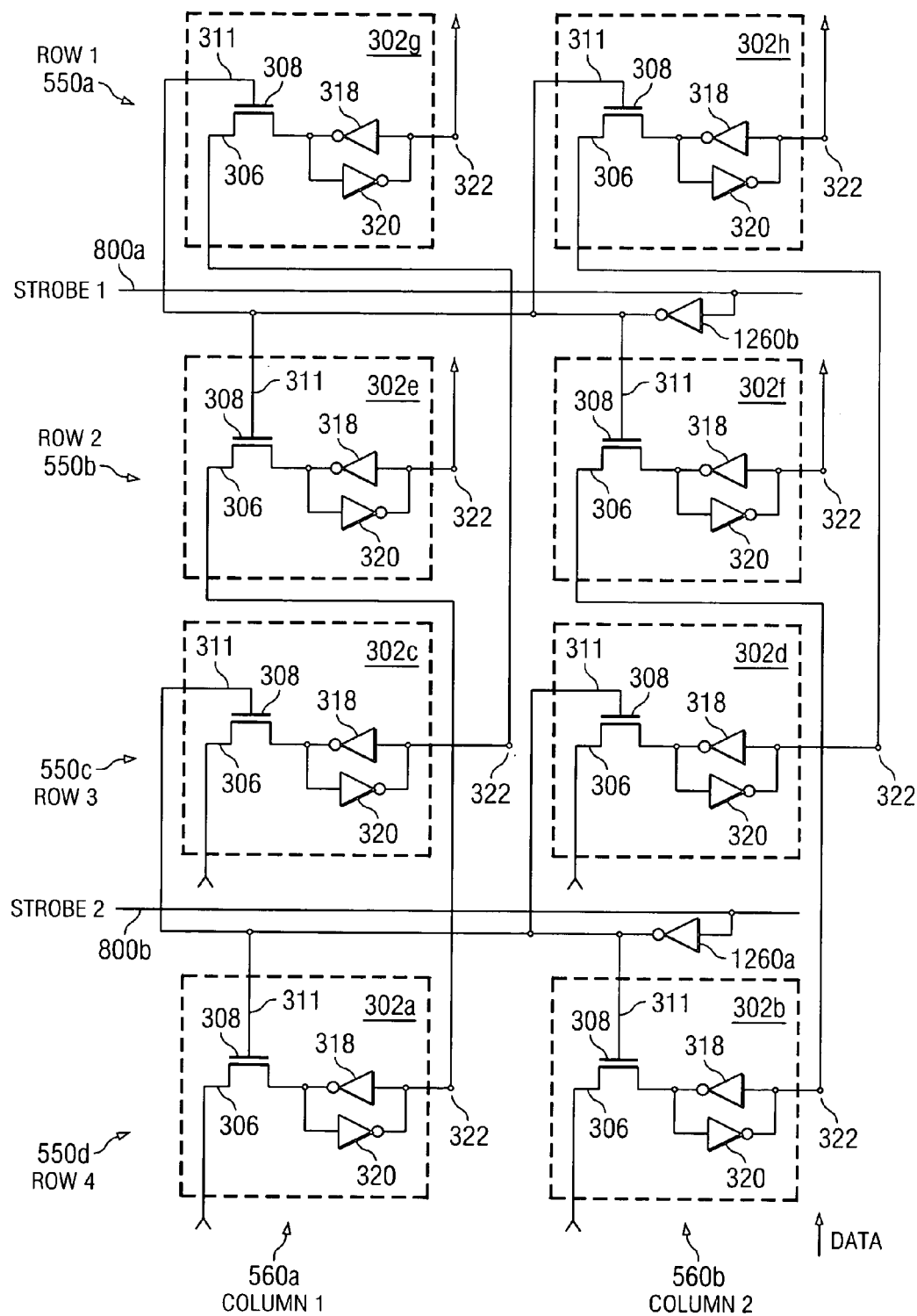

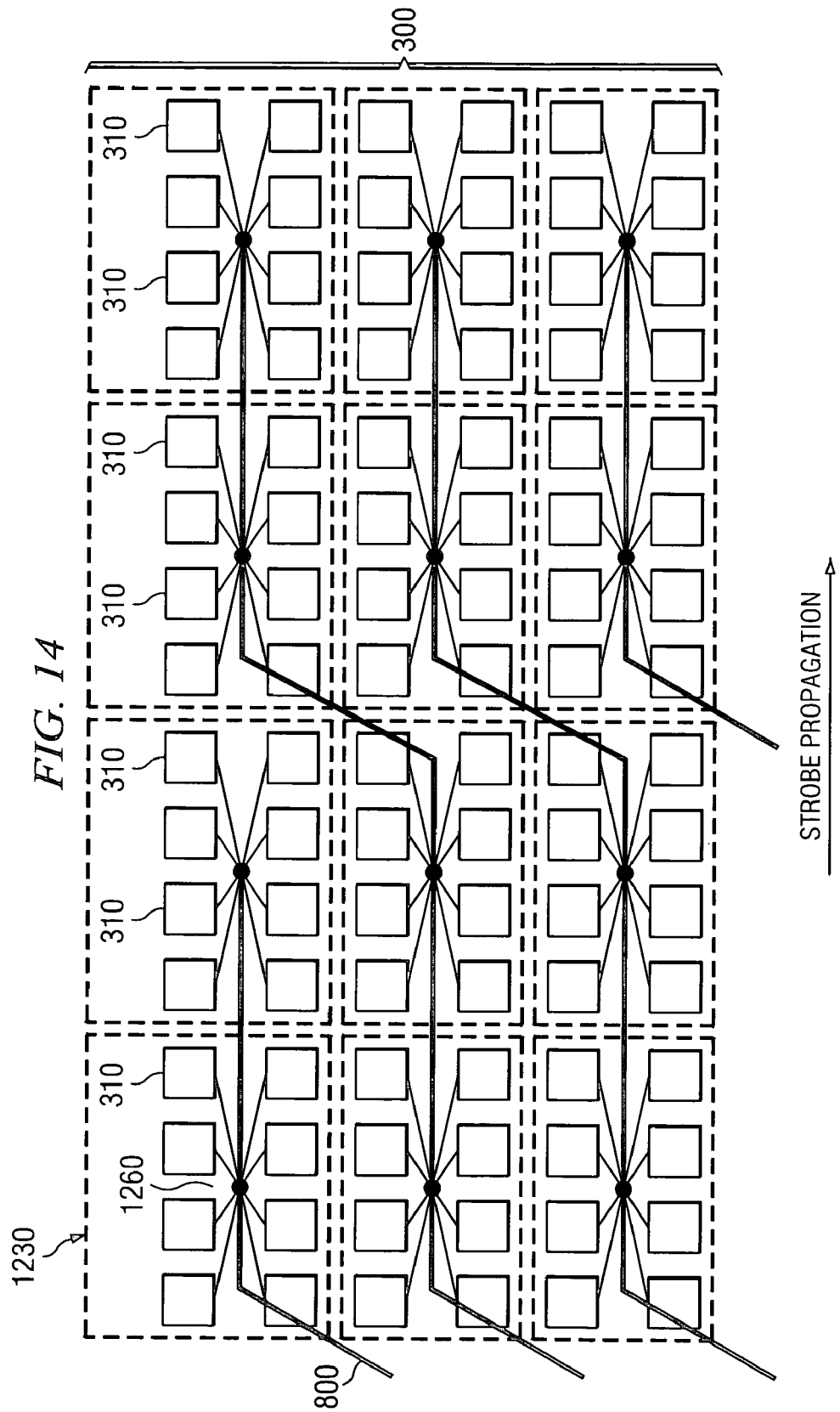

BUFFERS FOR LIGHT MODULATION ELEMENTS IN SPATIAL LIGHT MODULATORS

CROSS-REFERENCE TO RELATED APPLICATIONS

This application is related by subject matter to U.S. Utility Applications Ser. Nos. 10/810,414, entitled ANGLED STROBE LINES FOR HIGH ASPECT RATIO SPATIAL LIGHT MODULATOR; and No. 10/811,407, entitled SPATIAL LIGHT MODULATOR AND METHOD FOR INTERLEAVING DATA, each filed on an even date herewith.

BACKGROUND OF THE INVENTION

1. Technical Field of the Invention

The present invention relates generally to photolithography, and more specifically, to dynamic photolithography systems.

2. Description of Related Art

Recently, dynamic photolithography systems have been developed that employ a spatial light modulator (SLM) to define a pattern that is imaged onto a substrate having a photosensitive surface, such as a layer of photoresist. SLMs are electrical devices that include an array of individually controllable light modulation elements (e.g., liquid crystal cells or micromirrors) that define pixels of an image in response to electrical signals. Typically, at small feature sizes (e.g., 5 µm or smaller), there are tens of millions of light modulation elements within an SLM that is not more than a few square centimeters in area. For example, an SLM including an array of 16,384 columns by 606 rows of 3 µm light modulation elements has been proposed for use in transferring such small feature sizes.

With the small SLM size, multiple exposures are generally required to image the entire area of the substrate. Since the image formed by the SLM is easily reconfigurable, it is a relatively simple process to divide the final image into sections, configure the SLM to transfer one of the image sections onto the appropriate area of the substrate surface, shift the relative position of the substrate and SLM and repeat the process for each image section until the entire image is transferred onto the substrate surface.

However, with the large number of light modulation elements, it is impracticable to assume that the SLM will be free from defects. Statistically, there will be at least a few of the tens of millions of light modulation elements of the SLM that are defective. As a result of the multiple imaging process, each defective light modulation element produces N pixel defects on the substrate surface, where N is the number of sections the image is divided into. To limit the number of defects in the transferred image caused by defective light modulation elements, the data can be shifted through the SLM to transfer each image section onto the same portion of the substrate multiple times using different light modulation elements in the SLM, as described in co-pending and commonly assigned U.S. application for patent Ser. No. 10/73126.

Strobe lines within the SLM provide strobe signals to the light modulation elements to drive the data shifting between the light modulation elements in a shift register configuration. To reduce the time necessary to shift the data through the SLM, the data can be shifted through the SLM in an interleaving pattern by connecting each strobe line to multiple rows or columns of light modulation elements. However, connecting multiple rows and/or columns to each strobe line increases the load on each strobe line by a factor proportional to the number of rows and/or columns connected to the strobe line. In addition, a short in one of the light modulation elements may disable all of the light modulation elements connected to the same strobe line.

Therefore, what is needed is a strobe line configuration to reduce the load on the strobe lines and reduce the effect of shorts.

SUMMARY OF THE INVENTION

Embodiments of the present invention provide an electronic circuit. The electronic circuit can be used in a spatial light modulator, for example. The electronic circuit includes circuit elements arranged in an array of rows and columns. The circuit elements are alterable in response to data stored therein, and are configured to shift data between the circuit elements. A strobe line is electrically coupled to a set of the circuit elements to provide a strobe signal thereto. The strobe signal causes the circuit elements in the set to shift the data to circuit elements outside of the set. A strobe buffer is connected between the strobe line and at least two of the circuit elements within the set to buffer the strobe signal on the strobe line and to provide a buffered strobe signal to the at least two circuit elements within the set.

In one embodiment, the strobe buffer operates to amplify the strobe signal received on the strobe line and to provide an amplified strobe signal as the buffered strobe signal. In further embodiments, the strobe buffer prevents a short in one of the at least two circuit elements from disabling others of the circuit elements coupled to the same strobe line.

In further embodiments, the set of circuit elements includes circuit elements located in at least a portion of at least two adjacent rows or columns of the array. In another embodiment, the strobe line is coupled to at least two groups of circuit elements positioned non-orthogonally with respect to one another in the array.

In still a further embodiment, a data buffer is connected one end of the array to provide the data to the circuit elements. The data buffer is configured to load data into circuit elements in at least a portion of two rows of the array. In one embodiment, the data buffer includes at least two buffer elements, each loading data into a respective portion of the array. The strobe line is located in a second portion of the array, and is connected to clock one of the buffer elements associated with a first portion of the array to load data into the first portion of the array. A shift register is electrically connected to the strobe lines to sequentially apply the strobe signal to the strobe lines.

Other embodiments of the present invention provide a process for performing photolithography, in which data representing an image is loaded into light modulation elements. Certain ones of the light modulation elements are altered in response to the data loaded into the light modulation elements to transfer an instance of the image onto a substrate. Strobe signals are applied to respective sets of the light modulation elements and are buffered among at least two of the light modulation elements within each set. The strobe signals cause the data to be shifted between the light modulation elements in different sets. Additional ones of the light modulation elements are altered in response to the shifted data to transfer another instance of the image onto the substrate.

By buffering the strobe signals between the light modulation elements, the load on the individual strobe lines is reduced. In addition, buffering the strobe signals reduces the effect of a short in a light modulation element by preventing the short from disabling other light modulation elements coupled to the same strobe line. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show sample embodiments of the invention and which are incorporated in the specification hereof by reference, wherein:

FIG. 3 is a circuit schematic of an exemplary spatial light modulator for shifting data through the spatial light modulator, in accordance with embodiments of the present invention;

FIG. 4 is a representation of an exemplary shift register configuration of light modulation elements within the spatial light modulator of FIG. 3;

FIG. 6 is a timing diagram for shifting data between the light modulation elements;

FIG. 7 illustrates an exemplary substrate exposure timing sequence;

FIG. 9 illustrates an exemplary data interleaving configuration between light modulation elements, in accordance with embodiments of the present invention;

FIG. 10 illustrates a logical interleaved association between pixel controllers and memory elements within respective light modulation elements of a spatial light modulator, in accordance with embodiments of the present invention;

FIG. 13 is a circuit schematic of an exemplary spatial light modulator including strobe buffers, in accordance with embodiments of the present invention;

FIG. 14 illustrates an exemplary spatial light modulator including an angled strobe line configuration utilizing strobe buffers, in accordance with another embodiment of the present invention;

DETAILED DESCRIPTION OF EXEMPLARY EMBODIMENTS

Figure 1:
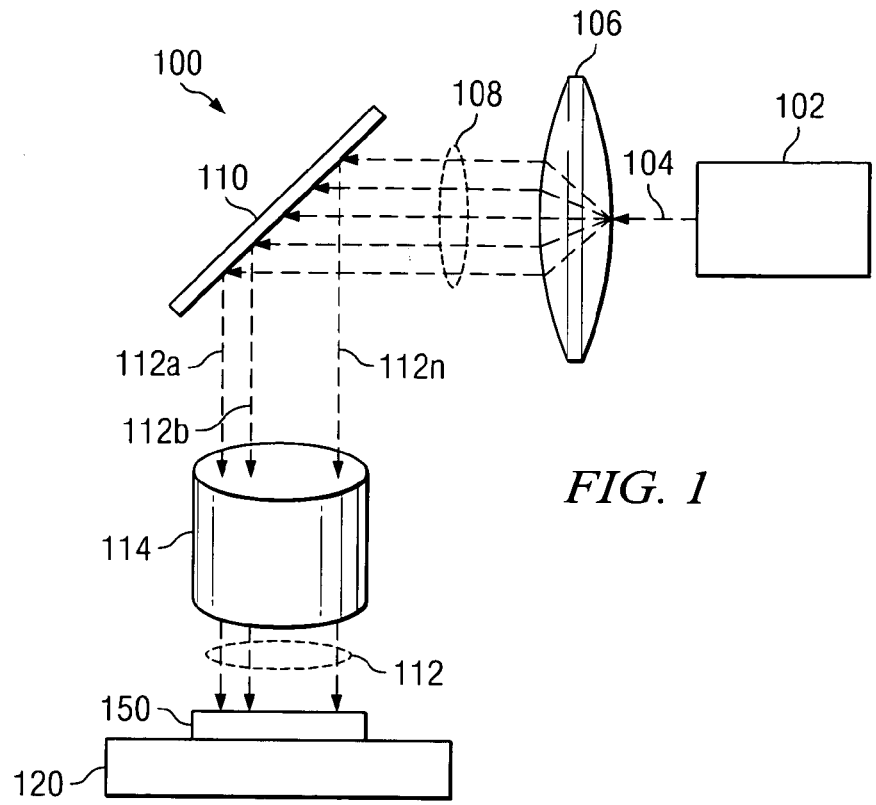
FIG. 1 illustrates a photolithography system utilizing a spatial light modulator to photolithographically transfer an image to a substrate in accordance with embodiments of the present invention.

FIG. 1 illustrates a dynamic photolithography system 100 for photolithographically transferring an image to a substrate 150. The photolithography system 100 includes a light source 102 operable to output light 104. The light source 102 can be a laser, such as an excimer laser, or other non-laser source, as understood in the art. The light source 102 is optically coupled to beam shaping optics 106. The output of the beam shaping optics 106 is light 108 that is directed toward a spatial light modulator 110 in accordance with embodiments of the present invention. The spatial light modulator 110 includes light modulation elements (not shown) operable to selectively transfer the light 108. The light modulation elements are described in more detail below in connection with FIG. 3. In one embodiment, the light modulation elements are liquid crystal elements. However, it should be understood that in other embodiments, the light modulation elements are micromirrors or another type of optical device that can selectively transfer light by reflection, transmission or otherwise.

The output of the spatial light modulator 110 includes dark areas with no light and light areas made up of multiple light beams 112a–112n (collectively 112) that are transferred by selected light modulation elements to form at least a portion of an image containing a pattern. The light beams 112 are directed to projection optics 114, which is optically aligned to direct the light beams 112 onto the substrate 150. A photosensitive layer (not shown), such as a layer of photoresist, is on the surface of the substrate 150. The photosensitive layer reacts in response to the light beams 112 to produce the pattern on the surface of the substrate 150. In one embodiment, the substrate 150 is mounted on a scanning stage 120 to move the substrate 150 in any direction relative to the spatial light modulator 110. The scanning stage 120 can be, for example, a high precision scanning stage. In another embodiment, the substrate 150 remains stationary and the optics and/or light beams 112 move relative to the substrate 150. In either configuration, one of the substrate 150 and the spatial light modulator 110 is moved relative to the other to transfer the image onto the substrate 150.

The spatial light modulator 110 further includes pixel drive circuits (not shown) that are uniquely coupled to the light modulation elements. The pixel drive circuits are described in more detail below in connection with FIG. 3. The pixel drive circuits store data that define the state of the light modulation elements. For example, light modulation elements that are reflective can be selectively altered to be in a reflective or non-reflective state such that the received light 108 is either reflected or not reflected onto the substrate 150 by storing data (e.g., logical LOW and HIGH data values) in pixel drive circuits associated with the light modulation elements. In effect, the spatial light modulator 110 operates as a dynamic mask that forms a pattern that is imaged onto the photosensitive layer of the substrate 150.

Figure 2:
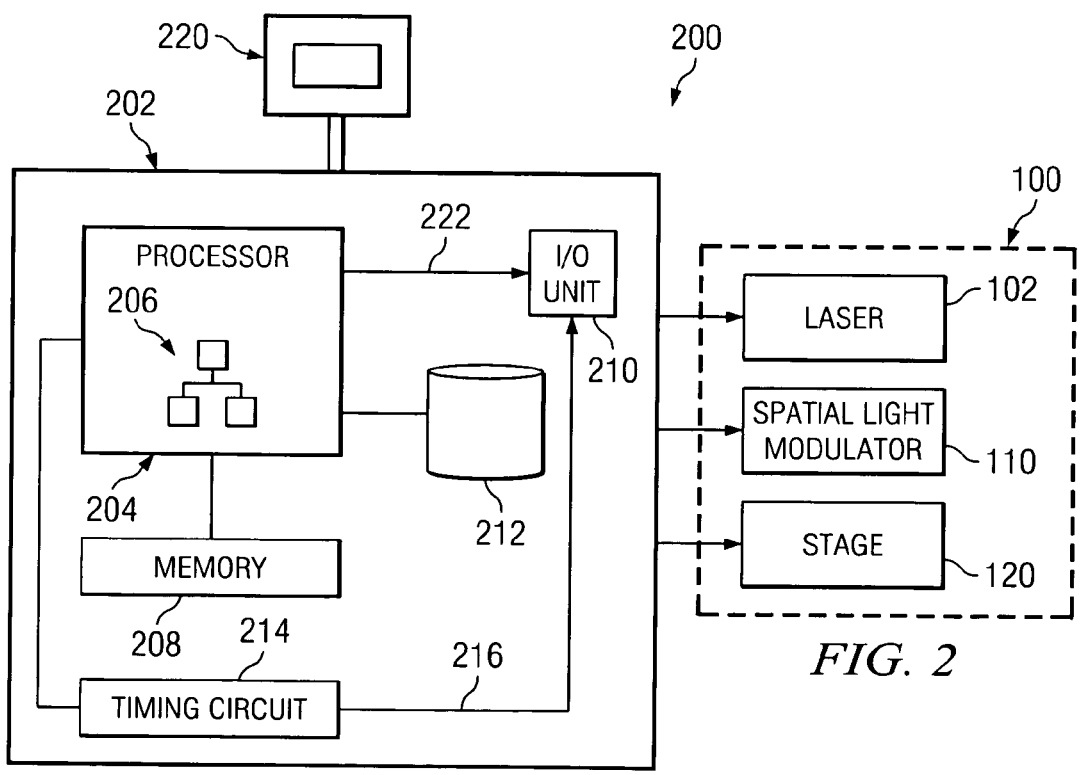
FIG. 2 is a block diagram illustrating a computing system operable to control the photolithography system of FIG. 1.

FIG. 2 is a block diagram illustrating the configuration 200 of a computing system 202 operable to control the photolithography system 100 of FIG. 1. The computing system 202 includes a processing unit 204 operable to execute software 206. The processing unit 204 can be any type of microprocessor, microcontroller, programmable logic device, digital signal processor or other processing device. The processing unit 204 is coupled to a memory unit 208 and input/output (I/O) unit 210. The I/O unit 210 can be wired or wireless. The processing unit 204 is further coupled to a storage unit 212 that stores the image to be transferred and timing circuit 214 that generates timing signals 216 for the photolithography system 100. An electronic display 220 is optionally coupled to the computing system 202 and operable to display an image (or portion of an image) that is to be communicated to the spatial light modulator 110 for imaging onto the substrate 150 of FIG. 1.

The timing signals 216 control the operation of the stage 120, spatial light modulator 110 and laser 102 during exposure cycles. Examples of timing signals 216 include data clock signals to sequentially clock data 222 representing a portion of an image into the spatial light modulator 110, strobe signals provided along strobe lines within the spatial light modulator 110 to shift data between light modulation elements of the spatial light modulator 110, exposure signals to initiate a flash of the laser 102, and other clock signals to drive the spatial light modulator 110, laser 102 and stage 120. The processor 204 communicates with the timing circuit 214 and I/O unit 210 to communicate the data 222 and timing signals 216 to the spatial light modulator 110 and other components of the photolithography system 100, such as the laser 102 and stage 120. For example, during an exposure cycle, data 222 is shifted between light modulation elements within the spatial light modulator 110 by strobe signals, data 222 is transmitted from the computing system 202 to the spatial light modulator 110 in response to a data clock signal and the other clock signals drive the SLM 110, stage 120 and laser 102 to alter the state of light modulation elements within the SLM 110 as a function of the data 222, to align the stage 120 with the SLM 110 for image transfer and to control the timing of the exposure signal to initiate the laser 102 flash.

To reduce defects in the transferred image due to light modulation element defects, the data 222 communicated to the SLM 110 during each exposure cycle includes only a portion of the image to enable optical oversampling of the image on the substrate. An example of an optical oversampling technique is described in co-pending and commonly assigned U.S. applications for patent Ser. Nos. 10/737,126 and 10/736,090, which are incorporated by reference herein.

In one embodiment, the image is divided into sections, with each section transferred by the SLM 110 during a single exposure cycle. In addition, each section is divided into subsections, such that the data 222 sent to the SLM 110 represents at least one of the image subsections. The data representing the remaining image subsections of a particular image section are shifted within the SLM 110 to enable the remaining image subsections to be imaged by different light modulation elements of the SLM 110.

For example, in one implementation embodiment, if each image section is divided into six image subsections, the data 222 includes data previously transferred to the substrate that represents five image subsections and data representing one new image subsection. However, with potentially tens of millions of light modulation elements, writing the data 222 representing all of the image subsections to the SLM 110 during each exposure cycle requires a large amount of data 222 to be communicated between the I/O unit 602 and the SLM 110. Such a large I/O bandwidth increases the power consumption and limits the throughput speed of the photolithography system 100. Therefore, in other implementation embodiments, the data 222 communicated to the SLM 110 during each exposure cycle includes only that representing the new image subsection(s) and not that representing any of the previously transferred image subsections in order to reduce bandwidth, thereby reducing power consumption and increasing throughput speed. The data representing the image subsections previously transferred to the substrate are stored within the SLM 110 and moved internally within the SLM 110.

FIG. 3 is a schematic of a portion of an exemplary spatial light modulator 110 capable of moving data internally during a photolithographic process. The SLM includes an array 300 of circuit elements, hereinafter referred to as light modulation elements 310a and 310b (collectively 310), each including a memory element 302 in communication with an associated pixel controller 304 that is at least partially responsible for controlling the state of a pixel defined by the light modulation element 310. In FIG. 3, each memory element 302 is a static memory element that includes an input line 306 and a forward access control element 308. In the example shown, the forward access control element 308 is a transistor having a forward access strobe line 311 that is operable to control the state of the forward access control element 308 during a shift forward operation. In FIG. 3, a shift forward operation shifts data up from light modulation element 310a to light modulation element 310b. Each memory element 302 further includes a reverse access control element 312 having a reverse access strobe line 314 operable to control the state of the reverse access control element 312 during a shift reverse operation. In FIG. 3, a shift reverse operation shifts data down from light modulation element 310b to light modulation element 310a.

Depending on the configuration of the array 300, light modulation elements 310a and 310b are either positioned in different columns of the same row or in different rows of the same column, as shown in FIG. 3. Thus, the memory elements 302 are configured to shift data bi-directionally between adjacent rows or columns of the array 300. In addition, it should be understood that in other embodiments, the memory elements 302 can additionally or alternatively be configured to shift the data between non-adjacent rows, columns or light modulation elements 310 of the array 300.

A common node 316 of the forward and reverse access control elements 308 and 312, respectively, is coupled to a memory cell 317. In one embodiment, the memory cell 317 is a bi-stable circuit or static latch utilized to store data representing one pixel of the image. The memory cell 317 is shown implemented as a latch (i.e., a switch and back-to-back inverters) that uses a ripple clock to propagate data between memory cells 317. The ripple clock is described in more detail below with reference to FIGS. 4–7.

Each memory cell 317 includes a forward inverter 318 and a feedback inverter 320. The feedback inverter 320 is a "weak" feedback element that is utilized to reinforce the current state (i.e., LOW or HIGH state) to a stable position. Thus, if the common node 316 is in a low voltage level (i.e., a LOW state), the forward inverter 318 inverts the LOW state to a HIGH state on the output coupled to output node 322. The HIGH state on output node 322 is an input to the feedback inverter 320, which outputs a low voltage level onto node 316. The low voltage level output from the weak feedback inverter 320 reinforces, but does not control, the LOW state on node 316. Similarly, a high voltage level output from the weak feedback inverter 320 reinforces, but does not control, the HIGH state on node 316.

The output node 322 is coupled to the pixel controller 304 and is also the output node of the light modulation element 310. In one embodiment, the pixel controller 304 is a pixel electrode of a liquid crystal (LC) light modulation element. The voltage level on output node 322 is applied to the pixel electrode of the LC light modulation element to alter the state of the LC light modulation element when the voltage level applied to the pixel electrode differs from a voltage applied to a common electrode of the LC light modulation element. In other embodiments, the pixel controller 304 is an electromechanical device controlling the state or position of a micromirror.

Multiple light modulation elements 310 are electrically interconnected. In one embodiment, the light modulation elements 310 are connected in a shift register configuration, as shown in FIG. 3. In the shift register configuration, the output node 322 of a first light modulation element (e.g., light modulation element 310a) is connected to the input line 306 of a second light modulation element (e.g., light modulation element 310b). The output node 322 of the second light modulation element 310b is connected to the input line of a third light modulation element (not shown), and so on until the output node of the (N-1)th pixel (not shown) is connected to the input line 306 of the Nth pixel (not shown), thereby forming a forward connection network. To load input data into the forward connection network, the input data is provided at the input line 306 of the first light modulation element 310a, and data is shifted from the first light modulation element 310a to the second light modulation element 310b when a strobe signal is received on forward access strobe line 311 of light modulation element 310a, and so on. It should be understood that a similar data loading and shifting configuration can be implemented for a reverse connection network, where data is input to the last light modulation element 310 in the array 300.

FIG. 4 is a block diagram of an exemplary high-level shift register configuration 400 of the light modulation elements 310. The light modulation elements 310 have forward access strobe lines 311 coupled thereto for causing data on the input lines 306 to propagate through the memory elements 302 (shown in FIG. 3) in the forward direction. The light modulation elements 310 can be viewed as elements N, N-1, N-2, N-3, and so forth, where the Nth light modulation element 310 is the last light modulation element and the (N-3)rd light modulation element 310 is the first light modulation element. The shift register configuration 400 can cause data to propagate between adjacent and/or non-adjacent rows and/or columns of an array of light modulation elements 310.

FIG. 6 is a timing diagram 605 for shifting data between the light modulation elements. As shown in FIG. 6, a sequence of non-overlapping strobe signals, produced by a ripple clock or otherwise, is utilized to shift the data through the light modulation elements. As shown, a strobe signal 602 is applied to the forward access control element 308 of the Nth light modulation element via forward access strobe line 311 between times $t_1$ and $t_2$ to move data out of the Nth light modulation element. Each of the other strobe signals 602 for the memory elements of the (N-1)th, (N-2)th and (N-3)th light modulation elements are pulsed sequentially such that the data is moved serially from the (N-1)th light modulation element to the Nth light modulation element between times $t_3$ and $t_4$, from the (N-2)th light modulation element to the (N-1)th light modulation element between times $t_5$ and $t_6$ and from the (N-3) the light modulation element to the (N-2)th light modulation element between times $t_7$ and $t_8$ so as to ensure the data is preserved as it is shifted through the light modulation elements. It should be understood that a similar shifting mechanism can be used to shift data in a reverse sequence to enable bi-directional data movement.

Figure 5:
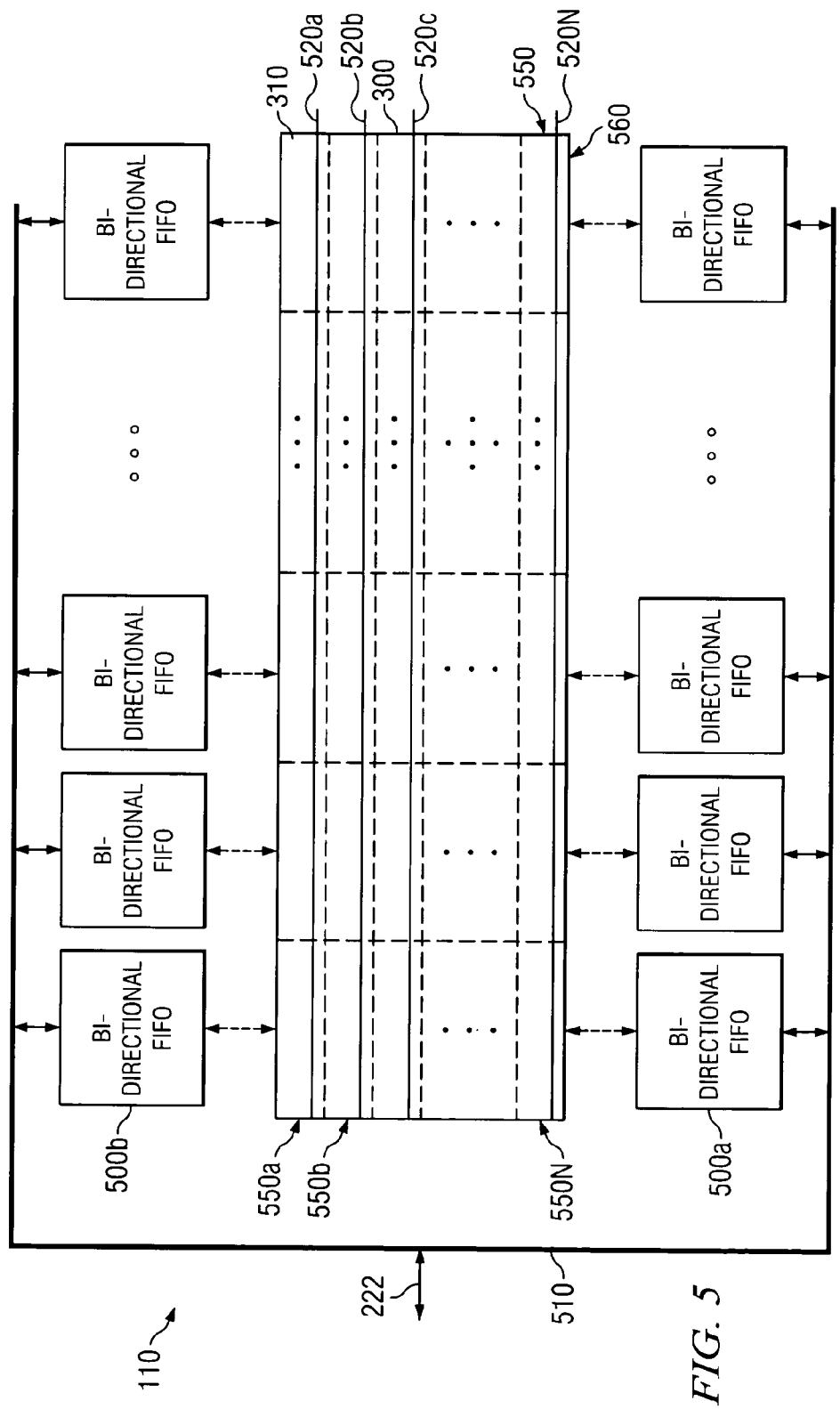
FIG. 5 is a block diagram of an exemplary spatial light modulator for loading data into the light modulation elements.

FIG. 5 is a block diagram of an exemplary configuration of the spatial light modulator 110 of FIG. 3 with the light modulation elements 310 arranged in a shift register configuration similar to that shown in FIG. 4. The array 300 of light modulation elements 310 is shown arranged in rows 550 and columns 560. There are more columns 560 than rows 550, resulting in a spatial light modulator 110 with a high aspect ratio. In the example shown in FIG. 5, the light modulation elements 310 are configured to shift data between rows 550 of the array 300. However, it should be understood that in other embodiments, the light modulation elements can be configured to shift data between columns 560 of the array 300.

In one embodiment, strobe lines 520a, 520b . . . 520N connected to forward access strobe lines 311 (shown in FIG. 3) of individual light modulation elements 310 run the length of the rows 550 to shift data between the rows 550. Thus, as a strobe signal is sent down each of the strobe lines, the data is shifted between rows 550. For example, assuming the data is shifted up in the array 300, at an initial time (e.g., $t_1$) a first strobe signal is sent down the strobe line 520a on row 550a of light modulation elements 310 to shift the data in row 550a of light modulation elements 310 out of the array 300. At a subsequent time (e.g., $t_2$), a second strobe signal is sent down the strobe line 520b on row 550b of the array 300 to shift the data from the light modulation elements 310 in row 550b to the light modulation elements 310 in row 550a. This process is continued until a strobe signal is sent down the strobe line 520N on row 550N of the array 300 to shift up the data in row 550N of light modulation elements 310.

In other embodiments, data 222 is input to the light modulation elements 310 via bus 510 and buffers 500a and 500b (collectively 500). Each data buffer 500 is a bi-directional first-in-first-out (FIFO) buffer that stores and loads data 222 into the light modulation elements 310 associated with the data buffer 500. In one embodiment, each data buffer 500 loads data 222 into a single column 560 of the array 300. In another preferred embodiment, each data buffer 500 loads data 222 into multiple columns 560 of the array 300. For example, after the data in the light modulation elements 310 in row 550N is shifted up, new data 222 is loaded into row 550N of light modulation elements 310 from buffers 500a. The data 222 output from the light modulation elements 310 in row 550a is additionally input to buffers 500b, which delay the data by a time corresponding to the time required to shift data from row 550N to row 550a. The data shifted out of row 550a can then be compared to the delayed original input data to determine if errors occurred during the data shifting and to identify potentially defective light modulation elements.

FIG. 7 illustrates an exemplary substrate exposure timing sequence using data shifting. FIG. 7 shows a series of liquid crystal (LC) settling intervals 702a–702e (collectively 702) during which the LC material settles between exposures. At the end of each LC settling interval 702, the laser is flashed (represented by 710). Between consecutive LC settling intervals 702, there are transition time intervals $tt_1$–$tt_5$. During each of the transition time intervals $tt_1$–$tt_5$, data is moved between the memory elements within the SLM in preparation for the next exposure. The timing circuit 214

(shown in FIG. 2) can be utilized to apply the strobe signals to the strobe lines 520 (shown in FIG. 5) to drive the data propagation.

The electrical state of a common electrode signal 712 alternates between consecutive ones of time intervals $tt_1$–$tt_5$. Transitions 708a–708e of the common electrode signal 712 occur during the time intervals $tt_1$–$tt_5$ after the laser flashes, shown at 710. In FIG. 7, two exemplary pixel electrode signals 704 and 706 are shown, where pixel electrode signal 704 is illustrative of that of an ON liquid crystal element and pixel electrode signal 706 is illustrative of that of an OFF liquid crystal element. At each laser flash 602, the pixel electrode signal 704 on the pixel electrode has the same potential as the common electrode, and the pixel electrode signal 706 on the pixel electrode has the opposite potential as the common electrode. During the transition time intervals $tt_1$–$tt_5$, data inversions are performed as data is shifting through the memory array to maintain DC balance of the liquid crystal elements. In one embodiment, the data is shifted between the memory elements of the light modulation elements during the transition time intervals $tt_1$–$tt_5$ in about 60 microseconds, which allows 940 microseconds of a one millisecond duty cycle for the liquid crystal material to respond to the electric field applied between the pixel electrode and the common electrode. A twenty-nanosecond (20 ns) flash of the laser 710 occurs at the end of each of the LC settling intervals 702 after the liquid crystal material has transitioned. It should be understood that other timings can be established to increase or decrease the LC settling intervals 702 and data shifting rates based on the transition rate of the liquid crystal material and speed of the substrate moving with respect to the spatial light modulator.

The transition time intervals $tt_1$–$tt_5$ between consecutive laser flashes 710 may be less than the time necessary to clock the data through the array of light modulation elements. In addition, with a shift register configuration of the light modulation elements, a defect at one point in the shift register chain caused by a defective light modulation element propagates from the defect point to the end of the chain, resulting in a large defective area in the array.

Figure 8:
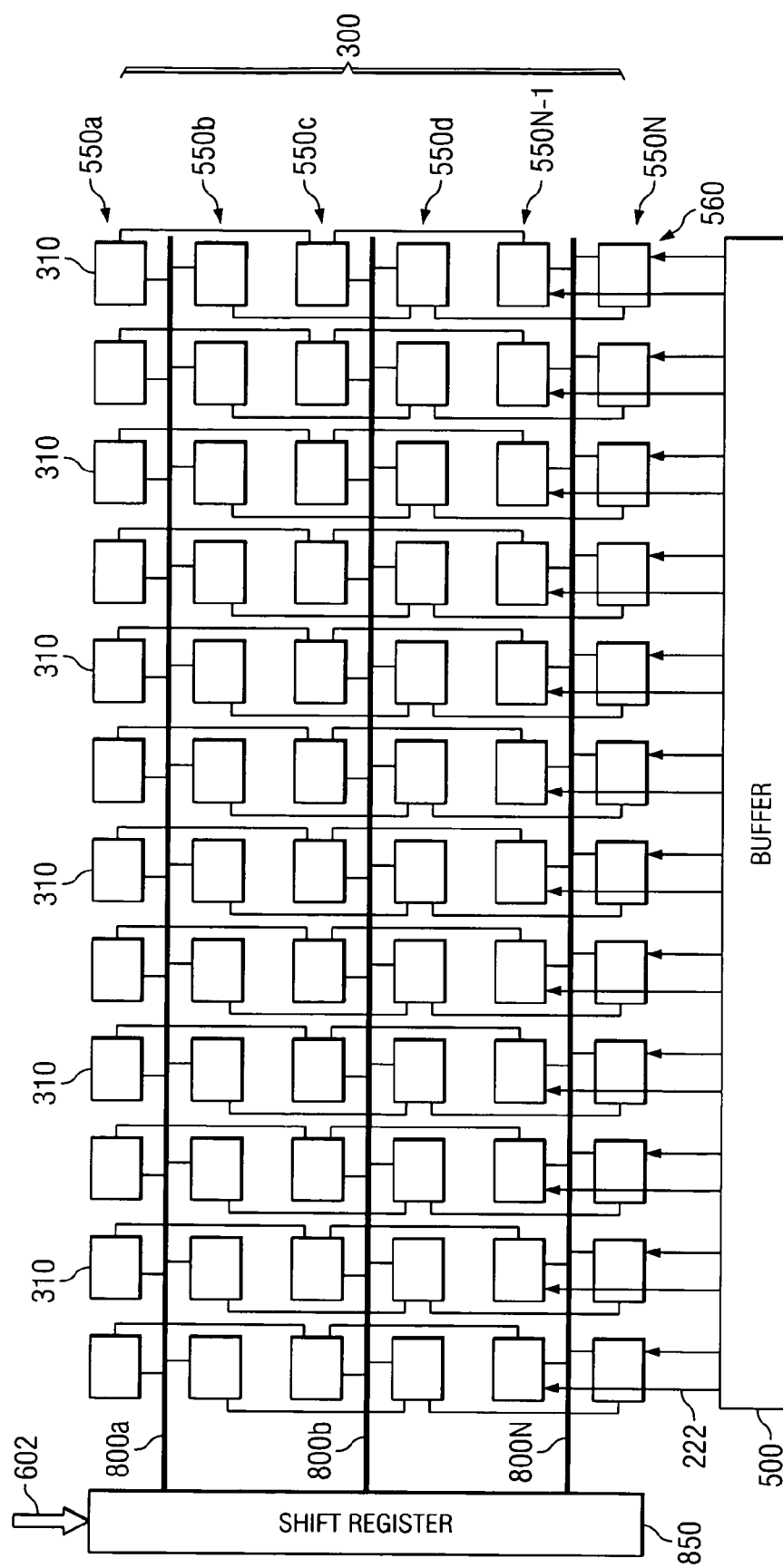
FIG. 8 illustrates an exemplary spatial light modulator including a strobe line configuration for interleaving data between light modulation elements, in accordance with embodiments of the present invention.

Another strobe line configuration is shown in FIG. 8. The light modulation elements 310 are arranged in an array 300 having rows 550a, 550b, 550c, 550d . . . 550N-1, 550N (collectively 550) and columns 560. In FIG. 8, the strobe lines 800a . . . 800N (collectively referred to herein as 800) are electrically coupled to two adjacent rows 550 of light modulation elements 310 within the array 300. Thus, each strobe line 800 provides the same strobe signal 602 to two rows 550 of light modulation elements 310, and the data is shifted through the array 300 in an interleaving pattern between non-adjacent rows 550 of light modulation elements 310. By providing the same strobe signal 602 to two rows 550 of light modulation elements 310, the data is shifted through the array 300 two rows 550 at a time, reducing the number of clock cycles required to shift the data through the array 300 by 1/I, where I is the interleave factor and is equal to the number of rows connected to a single strobe line 800.

Figure 12A:
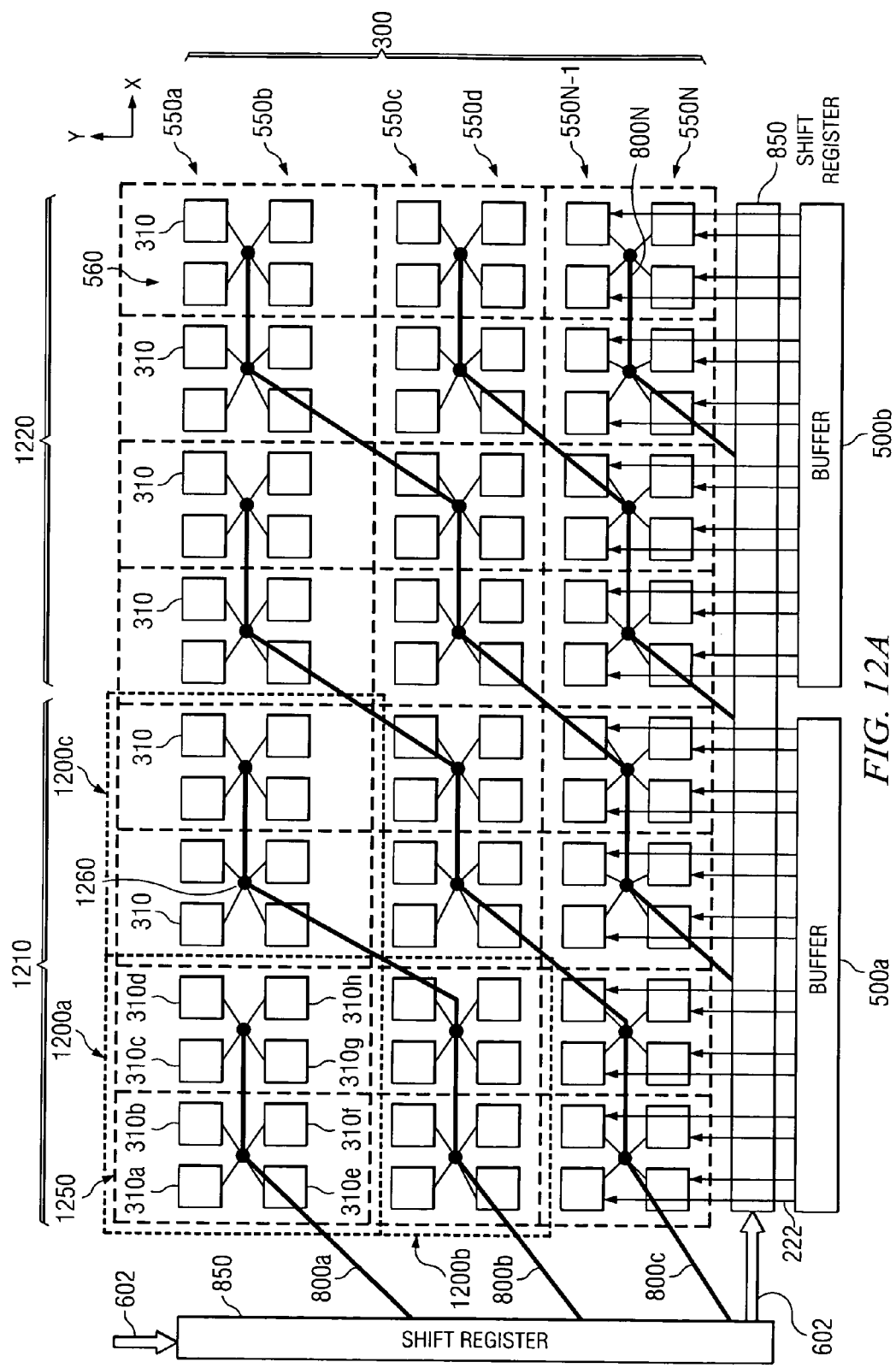
FIG. 12A illustrates an exemplary spatial light modulator including an angled strobe line configuration utilizing strobe buffers to reduce the load on the strobe lines, in accordance with embodiments of the present invention.

In other embodiments, each of the strobe lines 800 is electrically coupled to more than two rows 550 of light modulation elements 310. In another embodiment, the strobe lines 800 extend generally diagonally across the array 300 of light modulation element to alternately electrically connect to horizontally-adjacent and diagonally-adjacent light modulation elements 310 over two or more rows 550 to reduce the number of strobe lines 800. Such a configuration is shown in FIG. 12A, described in more detail below. In a further embodiment in which the data is shifted between columns 560 of the array 300, the strobe lines 800 are electrically coupled to two or more adjacent columns 560 of light modulation elements 310 within the array 300.

Each strobe line 800 is sequentially accessed using a shift register 850 that implements a digital delay line using a ripple clock to control the timing of the data shifting between the light modulation elements 310. For example, when a strobe signal 602 is sent from the timing circuit (214, shown in FIG. 2), the strobe signal 602 is input to the shift register 850 and is clocked through the shift register 850 to sequentially provide the strobe signal 602 to each of the strobe lines 800, starting with strobe line 800a to shift data out of the light modulation elements 310 in rows 550a and 550b of the array 300, continuing with strobe line 800b to shift data from the light modulation elements 310 in rows 550c and 550d to the light modulation elements 310 in rows 550a and 550b, respectively, and ending with strobe lines 800N to shift new data 222 into the light modulation elements 310 in rows 550N-1 and 550N of the array 300 from a data buffer 500 that stores the data 222 for rows 800N-1 and 800N.

In the example shown in FIG. 8, strobe line 800a provides strobe signal 602 to light modulation elements 310 in rows 550a and 550b to shift the data out of light modulation elements 310 in rows 550a and 550b. Strobe line 800b provides strobe signal 602 to light modulation elements 310 in rows 550c and 550d to shift data from the light modulation elements 310 in row 550c into the light modulation elements 310 in the corresponding columns 560 in row 550a and from the light modulation elements in row 550d into the light modulation elements in the corresponding columns 560 in row 550b. Strobe line 800N provides strobe signal 602 to light modulation elements 310 in rows 550N-1 and 550N to shift data from the light modulation elements 310 in row 550N-1 into the light modulation elements 310 in the corresponding columns 560 in row 550c and from the light modulation elements 310 in row 550N into the light modulation elements 310 in the corresponding columns 560 in row 550d. In addition, once the data is shifted out of the light modulation elements 310 in rows 550N-1 and 550N, new data 222 is shifted into the light modulation elements 310 in rows 550N-1 and 550N from the data buffer 500. With the data interleaving, the data buffer 500 is twice as wide to hold two rows of new data 222 at a time.

The data interleaving is illustrated in more detail in FIG. 9. Light modulation elements 310a–310h are shown arranged in a column 560. Strobe lines 800a–800d are connected to groups of two adjacent light modulation elements 310a–310h. For example, strobe line 800a is connected to provide the same strobe signal to light modulation elements 310a and 310b, strobe line 800b is connected to provide the same strobe signal to light modulation elements 310c and 310d, strobe line 800c is connected to provide the same strobe signal to light modulation elements 310e and 310f and strobe line 800d is connected to provide the same strobe signal to light modulation elements 310g and 310h.

When a strobe signal is provided along a strobe line (e.g., strobe line 800d) to two light modulation elements (e.g., 310g and 310h), the data stored in light modulation elements 310g and 310h is shifted up the column 560 in an interleaved pattern, such that data is shifted to non-adjacent light modulation elements. Thus, the data stored in light modulation element 310h is shifted up over input line 306a to light modulation element 310f and the data stored in light modulation element 310g is shifted up over input line 306b to light modulation element 310e. This pattern continues through the array of light modulation elements, shifting data two rows at a time over input lines 306a–306f between non-adjacent rows of light modulation elements. As a result, the effect of a defective light modulation element preventing propagation in the shift register chain is reduced. For example, if light modulation element 310h is defective, the defect is only propagated to light modulation elements 310f, 310d and 310b. The data in light modulation elements 310a, 310c, 310e and 310g is unaffected by defective light modulation element 310h.

FIG. 10 illustrates a logical interleaved association between pixel controllers 304a–304N (collectively 304) and memory elements 302a–302N (collectively 302) of respective light modulation elements of a spatial light modulator. The memory elements 302a–302N are shown divided into two groups 1000 and 1010. Each pixel controller 304 is associated with one of the memory elements 302 in either group 1000 or 1010 in an interleaving pattern. For example, pixel controller 304a is associated with memory element 302a in group 1000 and pixel controller 304b is associated with memory element 302b in group 1010. Data is consecutively shifted between memory elements 302 within the same group 1000 or 1010. Thus, data is consecutively shifted between memory elements 302a, 302c, 302e, 302g . . . 302N-1 within group 1000, and data is consecutively shifted between memory elements 302b, 302d, 302f, 302h . . . 302N within group 1010. Therefore, data is shifted through only a fraction of the memory elements 302, reducing the time required to shift the data through the memory elements 302 and reducing the effect of a propagation error between the memory elements 302.

Figure 11:
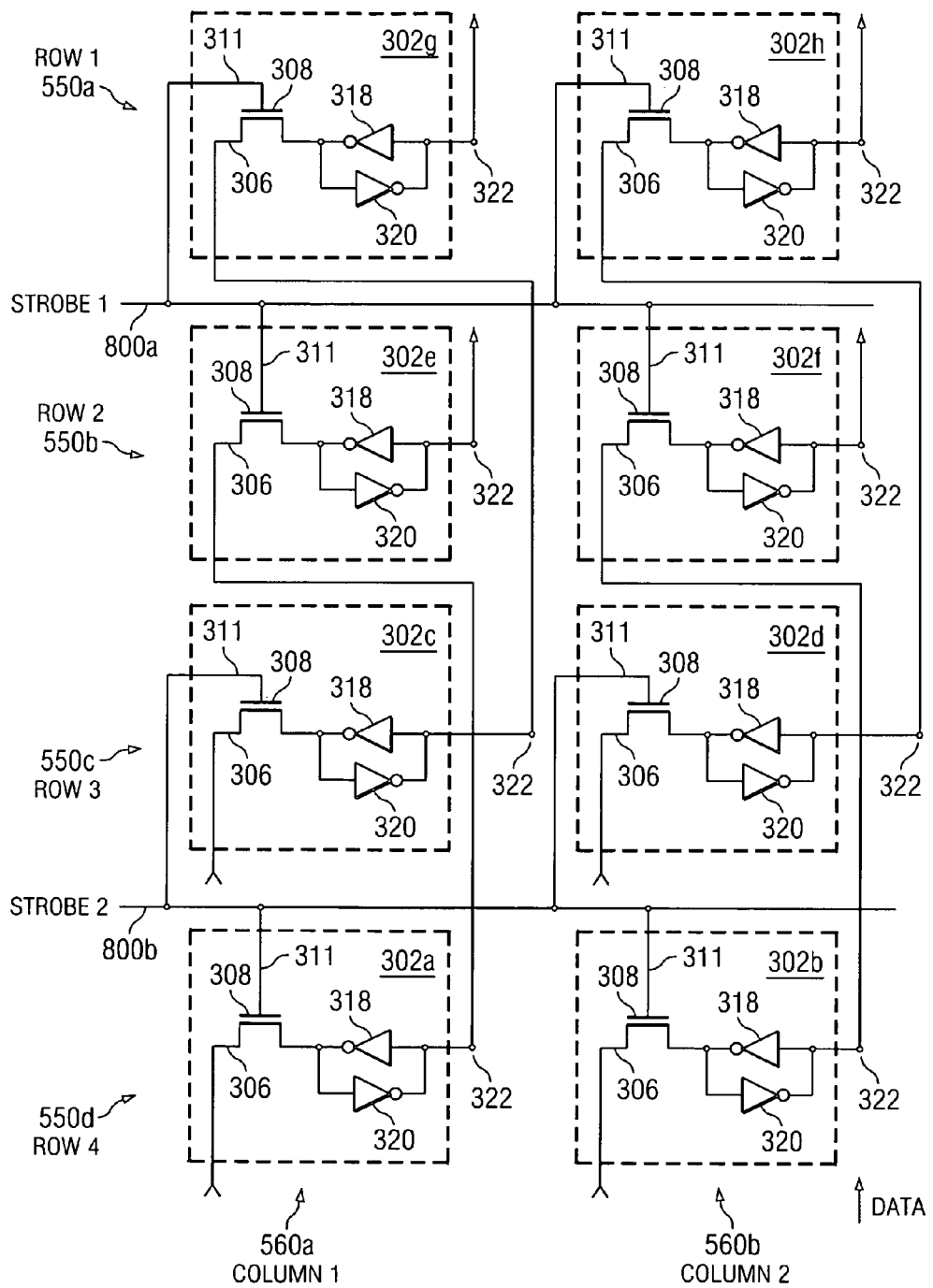
FIG. 11 is an exemplary circuit schematic of a spatial light modulator for shifting data between memory elements of non-adjacent light modulation elements in an interleaving pattern, in accordance with embodiments of the present invention.

An exemplary circuit schematic for shifting data between memory elements 302 of non-adjacent light modulation elements in an interleaving pattern is shown in FIG. 11. Each memory element 302a–302h (collectively 302) includes an input line 306 and a forward access control element 308, as described above in connection with FIG. 3. In the example shown in FIG. 11, the forward access control element 308 is a transistor having a forward access strobe line 311 that is operable to control the state of the forward access control element 308 during a shift forward operation. Each memory element 302a–302h further includes a forward inverter 318 and a feedback inverter 320, as also described above in connection with FIG. 3.

The memory elements 302 are connected in an interleaving shift register configuration. In the interleaving shift register configuration, an output node 322 of a first memory element (e.g., memory element 302a) is connected to the input line 306 of a second, non-adjacent memory element (e.g., memory element 302e). Similarly, the output node 322 of a third memory element 302b is connected to the input line 306 of a fourth, non-adjacent memory element (e.g., memory element 302f). Memory elements 302a and 302e are in the same column 560a, but different, non-adjacent rows 550d and 550b, respectively. Likewise, memory elements 302b and 302f are in the same column 560a, but different, non-adjacent rows 550d and 550b, respectively.

Data is shifted from memory element 302a to memory element 302e and from memory element 302b to memory element 302f when a strobe signal is received on forward access strobe lines 311 of memory elements 302a and 302b via strobe line 800b that is connected between rows 550c and 550d. Data is also shifted from memory element 302c to memory element 302g and from memory element 302d to memory element 302h when the strobe signal is sent down strobe line 800b. Similarly, data is shifted out of memory elements 302e, 302f, 302g and 302h when a strobe signal is received on forward access strobe lines 311 of memory elements 302e, 302f, 302g and 302h via strobe line 800a that is connected between rows 550a and 550b.

The strobe signal sent along strobe lines 800a and 800b is provided to multiple rows 550 of memory elements 302, thereby increasing the load on each of the strobe lines 800a and 800b by a factor proportional to the interleave factor I. For example, in FIG. 11, the load on each strobe line 800 is increased by a factor of two in comparison to the load on a strobe line connected to a single row 550. In addition, a short in one the memory elements 302 (e.g., memory element 302b) connected to a given strobe line would disable all the other memory elements 302a, 302c and 302d connected to the same strobe line 800b as memory element 302b.

Therefore, in accordance with embodiments of the present invention, FIG. 12A illustrates a strobe line configuration utilizing strobe buffers to reduce the load on the strobe lines and reduce the effect of shorts. In FIG. 12A, the light modulation elements are divided into clusters 1250 of four light modulation elements 310. Each light modulation element 310 within a cluster 1250 is coupled to a strobe line 800 through a strobe buffer 1260. The strobe buffer 1260 operates as a power amplifier to reduce the load on the strobe lines 800, while providing a strobe signal 602 of sufficient power to each of the light modulation elements 310.

In FIG. 12A, the strobe lines 800a, 800b, 800c . . . 800N are shown extending generally diagonally across the array 300 of light modulation elements 310. As used herein, the term "diagonal" means passing through at least two non-orthogonal light modulation elements 310, where "non-orthogonal" means positioned in different rows and different columns of the array 300. Those of the light modulation elements 310 connected to each of the strobe lines 800 constitute a set of the light modulation elements. Each of the strobe lines (e.g., 800b) is electrically coupled to the light modulation elements 310 in a first group (e.g., 1200b) and a second group (e.g., 1200c) in which the first group 1200b and second group 1200c are non-orthogonally positioned relative to one another within the array 300 of light modulation elements 310. The first group (e.g., 1200b) includes two clusters 1250 made up of the light modulation elements 310 in a portion of two adjacent rows (e.g., 550c and 550d) and the second group (e.g., 1200c) includes two additional clusters 1250 made up of the light modulation elements in a portion of two additional adjacent rows (e.g., 550a and 550b).

The strobe lines extending generally diagonally across the array 300 as shown in FIG. 12A reduces the length of individual strobe lines 800. This reduces clock skew and additionally allows the operational frequency of the spatial light modulator to be increased. In addition, angling the strobe lines 800 relative to the rows and columns results in strobe lines 800 that extend across only a portion of the total width of the array 300, which limits the extent of damage resulting from a failure in strobe line 800 to a smaller portion of the array 300. However, it should be understood that the strobe buffers 1260 can be used with any interleaved light modulation element strobe line configuration. For example, the strobe buffers 1260 can be used with a configuration similar to the one shown in FIG. 8 or with a column data-shifting configuration. As another example, the strobe buffers 1260 can be used with a single row or column strobe line configuration, in which each strobe line is connected to at least a portion of a single row or single column, to reduce the load on the strobe lines.

The operation of the strobe line configuration shown in FIG. 12A will now be described. Strobe line 800a provides a strobe signal to light modulation elements 310*a*–310*h* that are orthogonally-adjacent within group 1200*a* to shift the data out of light modulation elements 310*a*–310*h* in group 1200*a*. Light modulation elements 310*a*–310*d* in row 550*a* are horizontally-adjacent, i.e., adjacent in the x-direction, and light modulation elements 310*e*–310*h* in row 550*b* are horizontally-adjacent. In addition, light modulation elements 310*a*–310*d* are vertically adjacent, i.e., adjacent in the y-direction, to light modulation elements 310*e*–310*h*. Likewise, strobe line 800*b* provides a strobe signal to orthogonally-adjacent light modulation elements 310 within group 1200*b* and to orthogonally-adjacent light modulation elements 310 within group 1200*c*. Groups 1200*b* and 1200*c* are diagonally adjacent in the array 300. In addition, groups 1200*b* and 1200*c* are orthogonally-adjacent group 1200*a*. Specifically, group 1200*b* is vertically adjacent group 1200*a* and group 1200*c* is horizontally-adjacent group 1200*a*. Therefore, when a strobe signal is sent down strobe line 800*b*, data is shifted out of the light modulation elements 310 within group 1200*b* and into the light modulation elements 310 in the corresponding column 560 within group 1200*a* in an interleaved pattern, and data is shifted out of the light modulation elements 310 within group 1200*c*.

As described above in connection with FIG. 8, each strobe line 800 is sequentially accessed using a shift register 850 that implements a digital delay line using a ripple clock to control the timing of the data shifting between the light modulation elements 310. For example, when a strobe signal 602 is sent from the timing circuit (214, shown in FIG. 2), the strobe signal 602 is input to the shift register 850 and is clocked through the shift register 850 along the rows 550 in the y-direction and columns 560 in the x-direction to sequentially provide the strobe signal 602 to each of the strobe lines 800, starting with strobe line 800*a* and ending with strobe line 800N. Data for a first section 1210 of the array 300 is loaded into the light modulation elements 310 in rows 550N-1 and 550N in the first section 1210 in parallel from data buffer 500*a*, while data for a second section 1220 of the array 300 is loaded into the light modulation elements 310 in rows 550N-1 and 550N in the second section 1220 in parallel from data buffer 500*b*. It should be understood that multiple data buffers 500 can be used to store and input data into the array. For example, in one embodiment, 128 first-in-first-out (FIFO) buffers 500 are used, and each data buffer is 256 kbytes wide. It should further be understood that each FIFO 500 should be deep enough to hold at least two data segments, depending on the interleave factor, to allow variable scanning velocities.

In another embodiment in which the data is shifted between the columns 560 of the array 300, the strobe lines 800 are electrically coupled to groups of portions of vertically adjacent columns 560 of light modulation elements 310 diagonally positioned relative to one another. In a further embodiment, the strobe lines 800 can continue in the same pattern across the entire area of the array 300. In other embodiments, the strobe lines 800 can be arranged in a first pattern across a first portion of the array 300 and in a second pattern across a second portion of the array. For example, the strobe lines 800 can be arranged in two patterns that mirror one another, and the mirroring strobe lines 800 in each portion of the array 300 can be accessed simultaneously to increase the operational frequency of the strobe lines 800 of spatial light modulator, as described in co-pending and commonly assigned U.S. application for patent Ser. No. 10/810,414, which is incorporated by reference herein.

Figure 12B:
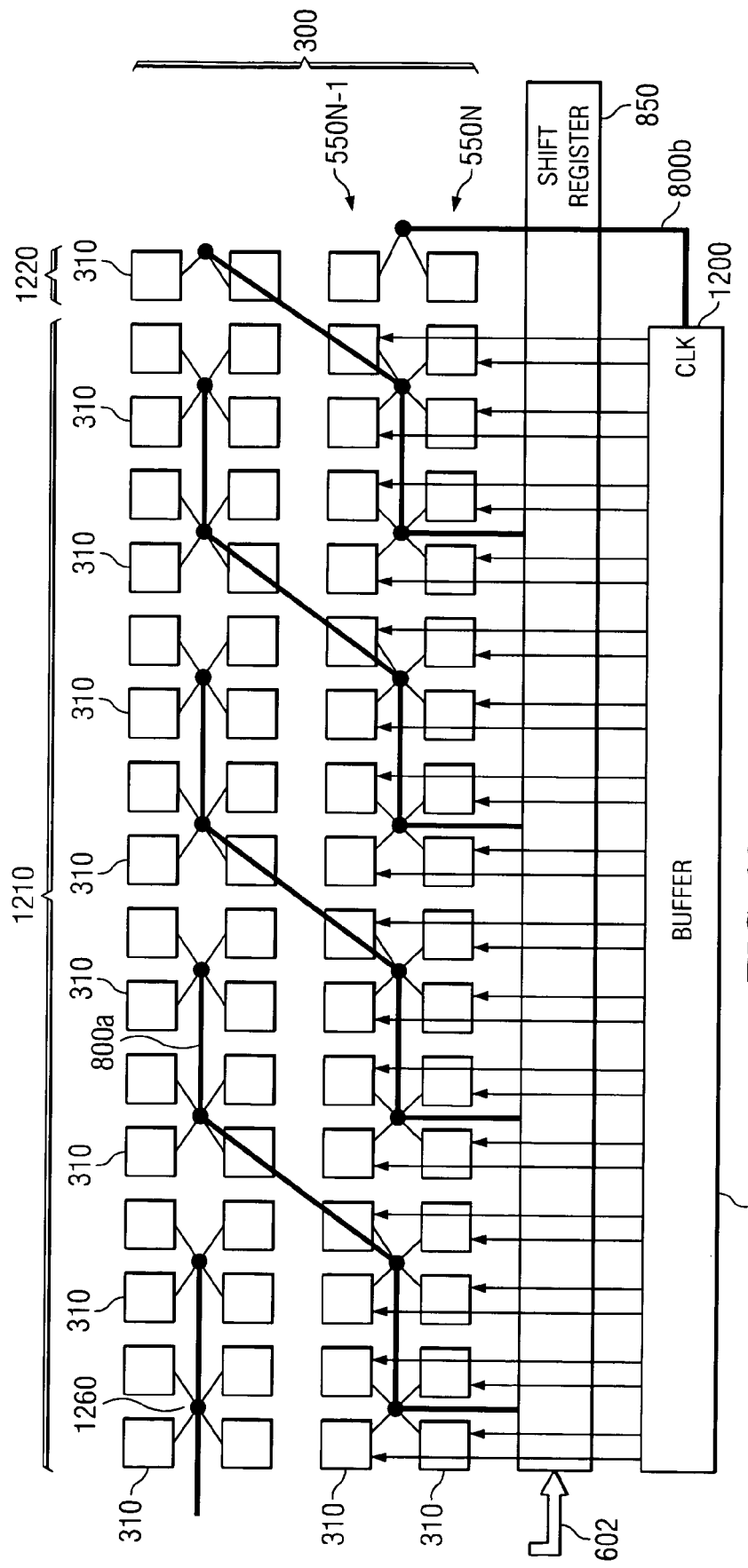
FIG. 12B illustrates an exemplary spatial light modulator including a strobe line configuration for loading data into the light modulation elements.

FIG. 12B illustrates an exemplary clocking arrangement for clocking the data buffers 500 in the strobe line configuration shown in FIG. 12A. Each data buffer 500 stores data for a section of the array 300 of light modulation elements 310. To ensure that the data is preserved as it is shifted through the light modulation elements 310 and to improve operational efficiency of the spatial light modulator, each data buffer 500 shifts data into the array 300 after the strobe signal passes the light modulation elements 310 associated with the data buffer 500. In the example shown in FIG. 12B, data buffer 500 loads data into light modulation elements 310 in rows 550N-1 and 550N within section 1210 of the array 300. As the strobe signal 602 propagates through all of the strobe lines 800*a* connected to the light modulation elements 310 within the first section 1210 via strobe buffers 1260, the data is shifted out of the light modulation elements 310 in rows 550N-1 and 550N within section 1210, enabling the light modulation elements 310 in rows 550N-1 and 550N within section 1210 to receive new data from the databuffer 500. When the strobe signal 602 reaches the first strobe line 800*b* within a second section 1220 of light modulation elements 310, adjacent the first section 1210 of light modulation elements 310, the strobe signal 602 is provided to the data buffer 500 for the first section 1210 of light modulation elements 310 to clock 1230 the data buffer 500 for the first section 1210 of light modulation elements 310, causing the data buffer 500 to advance (or load data) into the light modulation elements 310 in rows 550N-1 and 550N in the first section 1210.

Each strobe signal 602 propagating along the shift register 850 is separated by the width of the data buffer 500 from other strobe signals 602 to prevent advancement of the data buffer 500 during data shifting out of the light modulation elements 310 associated with the data buffer 500. For example, for a 256 wide FIFO 500, there are 32 strobe lines per FIFO 500. Therefore, the strobe signals 602 are spaced at least 33 clock cycles apart. As an example, a first strobe signal 602 is sent from the timing circuit (216, shown in FIG. 2) at time $t_0$, and a second strobe signal 602 is sent from the timing circuit at time $t_{33}$ to allow the first strobe signal 602 to propagate through all of the strobe lines 800*a* associated with a data buffer 500 and clock the data buffer 500 to load new data into the light modulation elements 310 in rows 550N-1 and 550N within the first section 1210 before the second strobe signal 602 is received by the first strobe line 800*a* associated with the data buffer 500.

FIG. 13 illustrates an exemplary circuit schematic for implementing strobe buffers 1260 within a spatial light modulator, in accordance with embodiments of the present invention. As described above in connection with FIG. 11, each memory element 302*a*–302*h* (collectively 302) includes an input line 306 and a forward access control element 308, which is shown as a transistor having a forward access strobe line 311 that is operable to control the state of the forward access control element 308 during a shift forward operation. Each memory element 302*a*–302*h* further includes a forward inverter 318 and a feedback inverter 320, as also described above in connection with FIG. 11.

The memory elements 302 are connected in an interleaving shift register configuration. In the interleaving shift register configuration, an output node 322 of a first memory element (e.g., memory element 302*a*) is connected to the input line 306 of a second, non-adjacent memory element (e.g., memory element 302*e*). Similarly, the output node 322 of a third memory element 302*b* is connected to the input line 306 of a fourth, non-adjacent memory element (e.g., memory element 302*f*). Memory elements 302*a* and 302*e* are in the same column 560*a*, but different, non-adjacent rows 550*d* and 550*b*, respectively. Likewise, memory elements 302b and 302f are in the same column 560a, but different, non-adjacent rows 550d and 550b, respectively.

Data is shifted from memory element 302a to memory element 302e and from memory element 302b to memory element 302f when a strobe signal is received on forward access strobe lines 311 of memory elements 302a and 302b via strobe line 800b and strobe buffer 1260b that is connected between rows 550c and 550d. Data is also shifted from memory element 302c to memory element 302g and from memory element 302d to memory element 302h when the strobe signal is sent down strobe line 800b and provided to memory elements 302c and 302d via strobe buffer 1260b. Similarly, data is shifted out of memory elements 302e, 302f, 302g and 302h when a strobe signal is received on forward access strobe lines 311 of memory elements 302e, 302f, 302g and 302h via strobe line 800a and strobe buffer 1260a that is connected between rows 550a and 550b.

In the exemplary embodiment shown in which each buffer 1260 is connected to four memory elements 302, the load on strobe lines 800a and 800b is approximately one-half of that in an embodiment in which the strobe lines drive a single row of memory elements 302. Each buffer 1260a and 1260b operates as a power amplifier to increase the power of the strobe signal received on the strobe lines 800 to a level sufficient to drive each of the individual memory elements 302 in multiple rows 550. In addition, the strobe buffers 1260a and 1260b isolate the forward access control elements 311 from the strobe signal. Therefore, a short in one the memory elements 302 (e.g., memory element 302b) does not disable others of the memory elements (not shown) connected by a different buffer (not shown) to the same strobe line (e.g., strobe line 800b) as the defective memory element (e.g., memory element 302b).

FIG. 14 illustrates an exemplary spatial light modulator including an angled strobe line configuration utilizing strobe buffers, in accordance with another embodiment of the present invention. The light modulation elements 310 in FIG. 14 are divided into clusters 1230 of eight light modulation elements 310. Each light modulation element 310 within a cluster 1230 is coupled to a strobe line 800 through a strobe buffer 1260. The strobe buffer 1260 operates as a power amplifier to reduce the load on the strobe lines 800, while providing a strobe signal 602 of sufficient power to each of the light modulation elements 310 in the cluster 1230. It should be understood that the strobe buffers 1260 can be used to connect any number of light modulation elements 310 to a strobe line 800 in any type of strobe line configuration.

Figure 15:
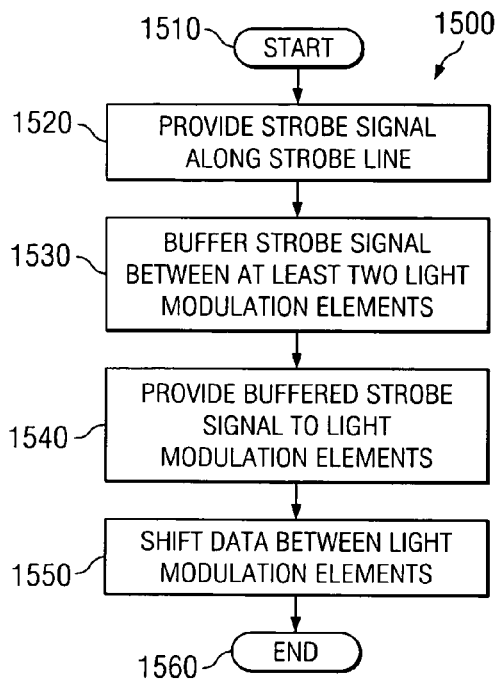
FIG. 15 is a flow chart illustrating an exemplary process to provide strobe signals to light modulation elements within a spatial light modulator to shift data between light modulation elements.

FIG. 15 is a flow chart illustrating an exemplary process 1500 to provide strobe signals to light modulation elements within a spatial light modulator to shift data between light modulation elements. The process starts at block 1510. At block 1520, a strobe signal is applied to a strobe line coupled to at least a portion of at least two adjacent rows or columns of light modulation elements. At block 1530, the strobe signal is buffered between at least two light modulation elements coupled to the strobe line. The buffered strobe signal is amplified and provided to the light modulation elements at block 1540 to trigger the shifting of data between non-adjacent ones of the light modulation elements in an interleaving pattern at block 1550. At block 1560, the process ends.

Figure 16:
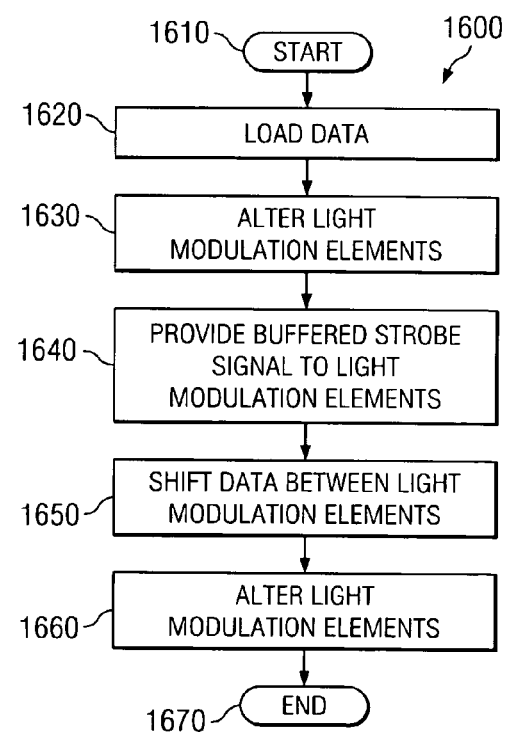
FIG. 16 is a flow chart illustrating an exemplary process for shifting data within a spatial light modulator to dynamically photolithographically transfer an image onto a substrate.

FIG. 16 is a flow chart illustrating an exemplary process 1600 for performing photolithography to transfer an image onto a substrate. The photolithography process starts at block 1610. At block 1620, data representing an image is loaded into light modulation elements within a spatial light modulator. At block 1630, the light modulation elements are altered in response to the data loaded thereinto. The altered light modulation elements are illuminated to direct an illumination pattern onto the substrate. At block 1640, buffered strobe signals are applied to respective sets of the light modulation elements to cause the data to be shifted between the light modulation elements in different sets at block 1650. For example, each set can include a portion of at least two adjacent rows or columns of light modulation elements. The strobe signals can be buffered among at least two of the light modulation elements within each set to amplify the strobe signals before applying the strobe signals to the light modulation elements. At block 1660, the light modulation elements are altered again in response to the data moved between the light modulation elements. The process ends at block 1670.

The innovative concepts described in the present application can be modified and varied over a wide rage of applications. Accordingly, the scope of patented subject matter should not be limited to any of the specific exemplary teachings discussed, but is instead defined by the following claims.

I claim:

1. An electronic circuit, comprising:
  circuit elements arranged in an array of rows and columns, said circuit elements being alterable in response to data stored therein and configured to shift data therebetween;
  a strobe line electrically coupled to ones of said circuit elements constituting a set to provide thereto a strobe signal to cause said ones of said circuit elements in said set to shift the data to additional ones of said circuit elements outside said set; and
  a strobe buffer connected between said strobe line and at least two of said circuit elements within said set to buffer the strobe signal on said strobe line and provide a buffered strobe signal to said at least two of said circuit elements.

2. The electronic circuit of claim 1, wherein said strobe buffer operates to amplify the strobe signal received on said strobe line and to provide the amplified strobe signal as said buffered strobe signal.

3. The electronic circuit of claim 1, wherein said set comprises ones of said circuit elements located in at least a portion of at least two adjacent rows of said array.

4. The electronic circuit of claim 1, wherein said at least two of said circuit elements within said set are ones of said circuit elements located in two adjacent rows and two adjacent columns of said array.

5. The electronic circuit of claim 1, wherein said at least two of said circuit elements within said set are ones of said circuit elements located in two adjacent rows and four adjacent columns of said array.

6. The electronic circuit of claim 1, wherein:
  said strobe line is coupled to ones of said circuit elements located in a first pair of adjacent rows of said array to provide a first strobe signal to said ones of said circuit elements located in said first pair of adjacent rows; and
  said electronic circuit additionally comprises an additional strobe line coupled to ones of said circuit elements located in a second pair of adjacent rows of said array to provide a second strobe signal to said ones of said circuit elements located in said second pair of adjacent rows.

7. The electronic circuit of claim 6, wherein said first strobe signal is operable to shift data from said ones of said circuit elements in said first pair of adjacent rows to said ones of said circuit elements in said second pair of adjacent rows.

8. The electronic circuit of claim 1, wherein said strobe line is coupled to ones of said circuit elements in at least a portion of at least two adjacent columns of the array.

9. The electronic circuit of claim 1, wherein said strobe line is coupled to ones of said circuit elements in at least a portion of a single row or column of the array.

10. The electronic circuit of claim 1, wherein said strobe line is coupled to at least two groups of said circuit elements positioned non-orthogonally within the array with respect to one another in the array.

11. The electronic circuit of claim 1, further comprising:
a data buffer connected to at least one end of the array of said circuit elements to provide the data to said circuit elements.

12. The electronic circuit of claim 11, wherein said data buffer is configured to load data into ones of said circuit elements in at least a portion of at least two rows of the array.

13. The electronic circuit of claim 11, wherein said data buffer comprises buffer elements, each of said buffer elements loading data into a respective portion of the array, said strobe line being within a second portion of said array and being connected to clock one of said buffer elements associated with a first portion of the array to load data into the first portion of the array.

14. The electronic circuit of claim 1, wherein said circuit elements are light modulation elements, said light modulation elements including:
memory elements configured to store the data and connected to shift the data therebetween; and
pixel controllers configured to alter the state of respective ones of said light modulation elements in response to the data stored in respective ones of the memory elements.

15. The electronic circuit of claim 14, wherein each of said memory elements further includes an output node electrically coupled to said respective pixel controller and to an input node of a non-adjacent one of said memory elements.

16. The electronic circuit of claim 14, wherein said strobe buffer prevents a short in one of said at least two memory elements from disabling the other of said at least two memory elements.

17. The electronic circuit of claim 14, wherein said light modulation elements comprise liquid crystal material.

18. The electronic circuit of claim 17, wherein:
the pixel controllers include pixel electrodes configured to receive the data stored in the respective memory elements, and
said light modulation elements collectively comprise a common electrode configured to receive a common electrode signal for said light modulation elements.

19. The electronic circuit of claim 14, wherein:
said light modulation elements additionally include micromirrors, and
the pixel controllers comprise electromechanical devices configured to control the state of said respective ones of said micromirrors in response to the data stored in the respective ones of said memory elements.

20. The electronic circuit of claim 1, wherein said electronic circuit additionally comprises:
additional strobe lines; and
a shift register electrically connected to said strobe lines to apply strobe signals sequentially thereto.

21. The electronic circuit of claim 20, wherein said shift register implements a ripple clock.

* * * * *